United States Patent [19]

Yokoyama

[11] 4,446,442

[45] May 1, 1984

[54] AMPLIFIER CIRCUIT

[75] Inventor: Kenji Yokoyama, Hamamatsu, Japan

[73] Assignee: Nippon Gakki Seizo Kabushiki Kaisha, Hamamatsu, Japan

[21] Appl. No.: 308,578

[22] Filed: Oct. 5, 1981

[30] Foreign Application Priority Data

Nov. 19, 1980 [JP] Japan .................. 55-162884

[51] Int. Cl.³ .................. H03F 1/26; H03F 1/34
[52] U.S. Cl. .................. 330/149; 330/84
[58] Field of Search .................. 330/149, 267, 273, 84, 330/151

[56] References Cited

U.S. PATENT DOCUMENTS 4,152,059  5/1970  Gordon .

Primary Examiner—James B. Mullins
Assistant Examiner—G. Wan
Attorney, Agent, or Firm—Darby & Darby

[57] ABSTRACT

A BTL power amplifier circuit with substantially zero distortion is disclosed. A distortion detecting circuit is provided which employs a feed forward technique for sensing the distortion generated in one of two amplifiers constituting the BTL power amplifier circuit and then applying to the other of the two amplifiers so as to output the distortion having the same amplitude and polarity as the sensed distortion. The distortions derived from the two amplifiers are fully cancelled out across a load to each other.

9 Claims, 4 Drawing Figures

AMPLIFIER CIRCUIT

BACKGROUND OF THE INVENTION

This invention pertains to amplifier circuits with low distortion, and more specifically BTL (Balanced Transformerless) amplifier circuits with low distortion in which the principle of a feed forward technique is incorporated.

Among those known amplifier circuits, BTL amplifier circuits are extensively used particularly in the field of such as audio equipments due to certain inherent advantages over other conventional amplifier circuits such as SEPP (Single Ended Push-pull) amplifier circuits. A BTL amplifier circuit, when compared with a SEPP amplifier circuit, has an advantage that the former can obtain, with the same power source voltage as applied to the latter, about two times more load current and four times more output power than those of the SEPP amplifier circuit.

The principle of BTL amplifier circuits can be better understood by referring to FIG. 1. FIG. 1 shows a block diagram of one example of a prior BTL amplifier circuit comprising two amplifiers, designated by reference numerals 1 and 2 respectively and having gains which are equal in absolute value and opposite in phase to each other. An input signal is applied via an input terminal $T_1$ to the amplifiers 1 and 2. The amplifier 1 effects amplification of the input signal and develops at an output terminal $T_2$ an output signal same in phase as the input signal, while the amplifier 2 amplifiers the input signal and develops at an output terminal $T_3$ an output signal opposite in phase to the input signal. A load, e.g. a loudspeaker L, connected between the terminals $T_2$ and $T_3$ is driven by the two output signals each having the same amplitude and opposite polarity to each other.

It should be noted here that distortions generated in the respective amplifiers 1 and 2 are mostly opposite in phase to each other as is similar in the case of the output signals appearing at the output terminals $T_2$ and $T_3$. The distortions are accordingly superposed additively at the load. This is particularly true when the amplifiers 1 and 2 have substantially the same characteristics and hence the generated distortions within the amplifiers 1 and 2 have substantially the same amplitude and are opposite in phase to each other. In such a case the addition of the distortions across the load is enhanced to some degree.

In order to decrease the distortions of the prior BTL power amplifier circuit, therefore, it has been requisite to use the amplifiers 1 and 2 both with a low distortion factor, for example, class-A amplifiers. In result, this had led to a high cost of the circuit arrangement and moreover such disadvantage has been brought that a decrease of the power efficiency occurs in the amplifier circuits.

SUMMARY OF THE INVENTION

Accordingly, and object of the invention is to provide an amplifier circuit with low distortion, particularly applicable to a BTL power amplifier circuit.

It is another object of the invention to provide an amplifier circuit as described above, in which a high power efficiency is obtained with a low cost.

Briefly, in an amplifier circuit according to the invention, a feed forward technique is incorporated in order to cancel out the distortions generated within one of the amplifiers constituting a BTL amplifier circuit. The distortions developed at one of the two amplifiers are detected by a distortion detecting circuit, and then are supplied to the other of the two amplifiers so as to obtain at the output of the other amplifier the distortion signal having the same amplitude and polarity as the distortions derived at the one amplifier. Then, the distortions derived at the outputs of the two amplifiers is mutually cancelled out across a load.

This invention is applicable to an amplifier circuit of a type which comprises a first amplifier for amplifying an input signal to develop at the output thereof an output signal same in phase as the input signal, a second amplifier for amplifying the input signal to develop at the output thereof an output signal opposite in phase to the input signal, and a load connected between the outputs of the first and second amplifiers. An amplifier circuit according to the invention comprises a distortion detecting circuit for detecting the distortion generated in one of the first and second amplifiers and supplying the detected distortion into the other of the first and second amplifiers so as to develop at the output the distortion having the same amplitude and polarity as the distortion derived at the output of the one of the amplifiers.

Other objects and features of the invention will be apparent from the following description taken in conjunction with the accompanying drawings.

DETAILED DESCRIPTION OF THE PREFERRED EMBODIMENTS

Figure 1:
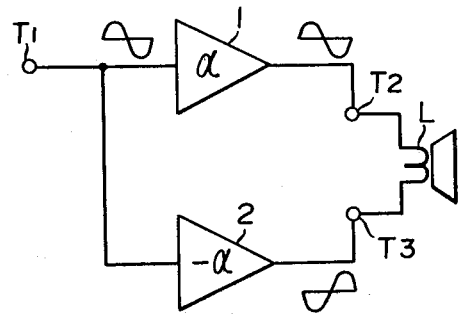
FIG. 1 shows a block diagram of a prior BTL amplifier circuit.
Figure 2:
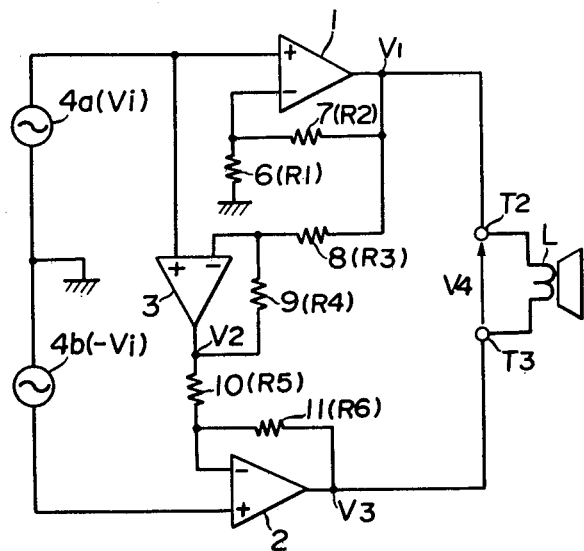
FIG. 2 is a schematic diagram showing a first embodiment of an amplifier circuit according to the invention.

A first embodiment of a BTL power amplifier circuit according to the invention is illustrated in FIG. 2 wherein corresponding parts to those in FIG. 1 are designated by identical reference characters. In the embodiment shown in FIG. 2, the signals of input signal sources $4_a$ and $4_b$ have equal amplitudes and opposite polarities to each other, the reference terminals of the both input signal sources $4_a$ and $4_b$ being grounded. A voltage signal $V_i$ of the input signal source $4_a$ is applied to the non-inverting input terminal of an amplifier 1 (which may be an power amplifier allowed to develop distortions to some extent), while a voltage signal $-V_i$ of the input signal source $4_b$ is applied to the non-inverting input terminal of an amplifier 2 (which is in this embodiment an power amplifier with low distortion characteristics such as a class-A power amplifier). The voltage signal $V_i$ of the input signal source $4_a$ is also applied to the non-inverting input terminal of an amplifier 3 (which is a voltage amplifier with low distortion characteristics including an operational amplifier, and functions as a distortion detecting circuit in this embodiment). A resistor 7 (resistance value $R_2$) is coupled between the output terminal and inverting input terminal of the amplifier 1, the inverting input terminal being grounded via a resistor 6 (resistance value $R_1$). The output of the amplifier 1 is fed to the inverting input terminal of the amplifier 3 via a resistor 8 (resistor value $R_3$). A resistor 9 (resistance value $R_4$) is coupled between the inverting input terminal and output terminal of the amplifier 3, the output of the amplifier 3 being fed to the inverting input terminal of the amplifier 2 via a resistor 10 (resistance value $R_5$), and a resistor 11 (resistance value $R_6$) being coupled between the inverting input and output terminal of the amplifier 2. The outputs of both the amplifiers 2 and 3 are respectively developed across output terminals $T_2$ and $T_3$ between which a load L such as a loudspeaker is connected.

In the BTL power amplifier circuit thus constructed, the following relation is obtained:

$$V_1 = \left(1 + \frac{R_2}{R_1}\right) V_i + V_d \tag{1}$$

wherein the output voltage of the amplifier 1 appearing at the output terminal $T_2$ is represented as $V_1$ and $V_d$ represents a voltage of distortion derived at the output of the amplifier 1. Representing the output voltage of the amplifier 3 as $V_2$ and utilizing the equation (1) above, the voltage $V_2$ is expressed as follows:

$$V_2 = V_i - \frac{R_4}{R_3}\left(\frac{R_2}{R_1} V_i + V_d\right) \tag{2}$$

Further assigning $V_3$ as to the output voltage of the amplifier 2 appearing at the output terminal $T_3$, and utilizing the equation (2) above, and with the distortion developed in the amplifier 2 being neglected, then the following equation holds:

$$V_3 = \left(\frac{R_2 \cdot R_4 \cdot R_6}{R_1 \cdot R_3 \cdot R_5} - \frac{2R_6}{R_5} - 1\right) V_i + \frac{R_4 \cdot R_6}{R_3 \cdot R_5} V_d \tag{3}$$

If the values of resistors 6 to 11 are set so as to meet the condition of $R_2/R_1 = R_3/R_4 = R_6/R_5$,
the above equation (3) is modified to indicate:

$$V_3 = -\left(1 + \frac{R_2}{R_1}\right) V_i + V_d \tag{4}$$

From the equations (1) and (4), a voltage $V_4$ developed across the load L, which is connected between the output terminals $T_2$ and $T_3$, is given by:

$$V_4 = 2\left(1 + \frac{R_2}{R_1}\right) V_i \tag{5}$$

As is readily understood from the equation (5), the voltage $V_d$ of the distortion generated in the amplifier 1 is fully cancelled out across the load L.

Figure 3:
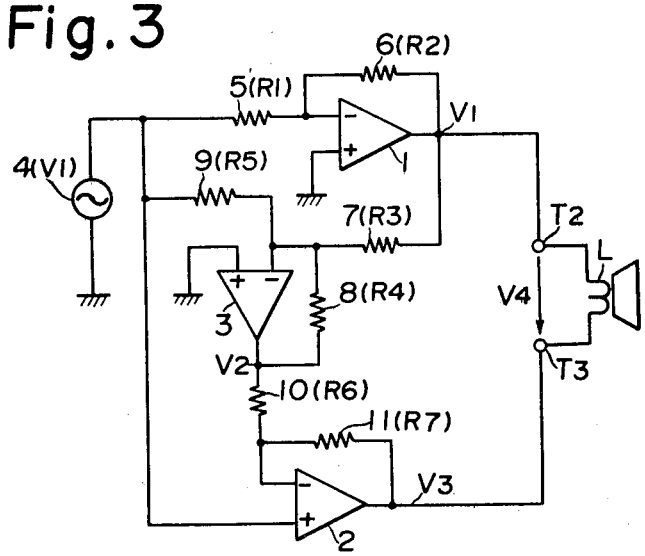
FIG. 3 is a schematic diagram showing a second embodiment of an amplifier circuit according to the invention.

Referring now to FIG. 3, there is shown a schematic diagram of a BTL power amplifier circuit of a second embodiment in accordance with the invention. The voltage signal of an input signal source 4 has a voltage value of $V_i$. The voltage signal $V_i$ is applied through a resistor 5 (resistance value $R_1$) to the inverting input terminal of an amplifier 1 (which may be a power amplifier allowed to develop distortions to some degree), and through a resistor 9 (resistance value $R_5$) to the inverting input terminal of an amplifier 3 (which is a voltage amplifier with low distortion characteristics including an operational amplifier), and further directly to the non-inverting input terminal of an amplifier 2 (which is an power amplifier with low distortion characteristics such as a class-A power amplifier). The non-inverting input terminal of the amplifier 1 is grounded and between the inverting input terminal and output terminal of the amplifier 1 a resistor 6 (resistance value $R_2$) is connected. The output of the amplifier 1 is fed through a resistor 7 (resistance value $R_3$) to the inverting input terminal of the amplifier 3, the non-inverting input terminal thereof being grounded and a resistor 8 (resistance value $R_4$) being connected between the inverting input terminal and output terminal of the amplifier 3. The output of the amplifier 3 is fed through a resistor 10 (resistance value $R_6$) to the inverting input terminal of the amplifier 2, a resistor 11 (resistance value $R_7$) being connected between the inverting input terminal and output terminal of the amplifier 2. The outputs of the both amplifiers 1 and 2 are respectively developed across output terminals $T_2$ and $T_3$ between which a load L such as a loudspeaker is connected.

In the BTL power amplifier circuit thus constructed, an output voltage $V_1$ of the amplifier 1 appearing at the output terminal $T_2$ may be expressed in the following:

$$V_1 = -\frac{R_2}{R_1} V_i + V_d \tag{6}$$

wherein $V_d$ represents a voltage of distortion generated in the amplifier 1. Representing the output voltage of the amplifier 3 (distortion detecting circuit) as $V_2$ and utilizing the equation (6) above, the voltage $V_2$ is expressed as follows:

$$V_2 = \frac{R_4}{R_3}\left(\frac{R_2}{R_1} V_i - V_d\right) - \frac{R_4}{R_5} V_i \tag{7}$$

Further assigning $V_3$ as to the output voltage of the amplifier 2 appearing at the output terminal $T_3$, and utilizing the equation (7) above, and with the distortion in the amplifier 2 being neglected, then the following equation holds:

$$V_3 = \tag{8}$$

$$\left(1 - \frac{R_2 \cdot R_4 \cdot R_7}{R_1 \cdot R_3 \cdot R_6} + \frac{R_4 \cdot R_7}{R_5 \cdot R_6} + \frac{R_7}{R_6}\right) V_i + \frac{R_4 \cdot R_7}{R_3 \cdot R_6} V_d$$

If the values of resistors 5 to 11 are set so as to meet the condition of both $$\frac{R_4 \cdot R_7}{R_3 \cdot R_6} = 1 \text{ and } \frac{R_2}{R_1} = \frac{R_3}{R_5},$$

the equation (8) is expressed as:

$$V_3 = \left(1 + \frac{R_7}{R_6}\right) V_i + V_d \tag{9}$$

From the equations (6) and (9), the voltage $V_4$ appearing across the load L connected between the output terminals $T_2$ and $T_3$ is given by:

$$V_4 = V_3 - V_1 = \left(1 + \frac{R_2}{R_1} + \frac{R_7}{R_6}\right) V_i \quad (10)$$

As evident from the equation (10) and similar to the first embodiment, the voltage $V_d$ of the distortion generated in the amplifier 1 disappears completely across the load L.

As discussed in the above first and second embodiments, it is to be noted that since the distortions generated in the amplifiers 1 and 1 are detected by the amplifiers 3 and 3, i.e., distortion detecting circuits, and then applied to the amplifiers 2 and 2, so as to produce at the respective output terminals thereof the distortion having the same amplitude and opposite polarity as those of the respective amplifiers 1 and 1, the distortions from the amplifiers 1 and 1 are completely cancelled out at the load L. Therefore, even if the power amplifiers 1 and 1 are used having relatively high distortions, such as for example class-B, class-D or class-E amplifier, the BTL power amplifier circuit as a whole affords a relatively low distortion so long as the amplifiers 2 and 2 are used having relatively low distortions, such as class-A amplifier. It is also appreciated that since the amplifiers 3 and 3 operate only to provide voltage amplification in the BTL power amplifier circuit the amplifiers 3 and 3 may be implemented easily and with low cost and low distortion by using such as a known operational amplifier.

Figure 4:
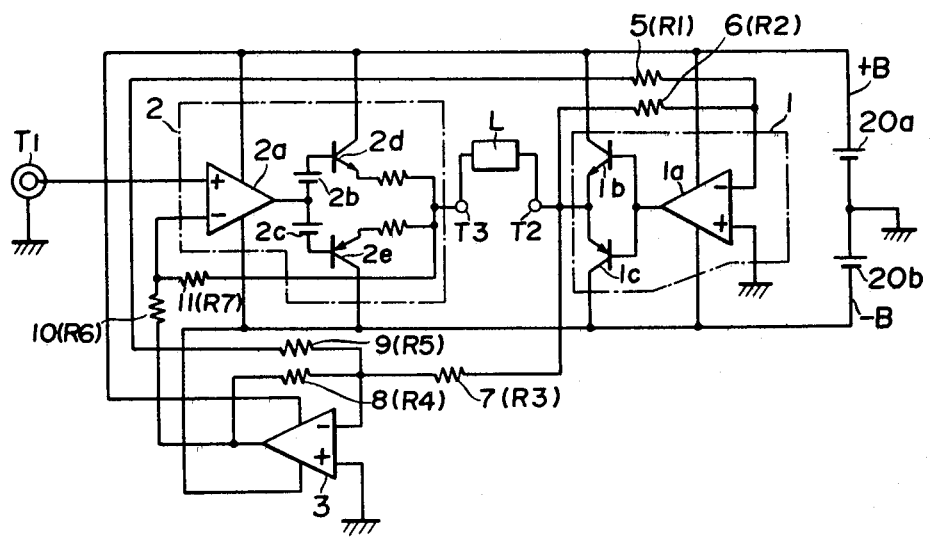
FIG. 4 is a more detailed schematic diagram showing the second embodiment in which power amplifying stages of two amplifiers constituting a BTL amplifier circuit and a power supply system are illustrated in more detail.

Referring to FIG. 4, there is shown a more concrete and detailed schematic representation of the BTL power amplifier circuit particularly adopting the principle of the second embodiment of the invention, in which corresponding elements to those in FIG. 3 are designated by the identical reference characters and the description thereof is omitted for brevity. In FIG. 4, an input signal to be amplified is applied to an input terminal $T_1$. In this embodiment, an amplifier 1 is comprised of an operational amplifier $1_a$ and a push-pull power amplification circuit (operating in a class-B mode) made of a combination of an NPN transistor $1_b$ and a PNP transistor $1_c$, and an amplifier 2 is comprised of an operational amplifier $2_a$ and a push-pull power amplification circuit (operating in a class-A mode) made of a combination of an NPN transistor $2_d$ and a PNP transistor $2_e$ and vias voltage sources $2_b$ and $2_c$. The amplifiers 1 to 3 are supplied with a positive and negative power voltages $+B$ and $-B$, respectively from power sources $20_a$ and $20_b$. The other circuit configuration and its operation is identical with those of the BTL power amplifier circuit shown in FIG. 3, and the values of resistors 5 to 11 is set so as to meet the condition of both $$\frac{R_4 R_7}{R_3 R_6} = 1 \text{ and } \frac{R_2}{R_1} = \frac{R_3}{R_5}.$$

In this embodiment, the amplifier 1 which operates in a class-B mode may generate distortion at an output terminal $T_2$. However, since the distortion voltage having the same amplitude and opposite polarity is also delivered at an output terminal $T_3$, the distortions appearing at the output terminals $T_2$ and $T_3$ will be cancelled out across an load L to each other. The amplifier 2 operates in a class-A mode so that it inherently generates little distortion, and thus the BTL power amplifier circuit as a whole has substantially no distortion at the load L.

While there have been shown and described some preferred embodiments of the present invention, it is to be understood that the present invention is not limited thereto but may be variously modified and practiced within the scope set forth in the attached claims.

What is claimed is:

1. An amplifier circuit comprising:
   a first amplifier being supplied with an input signal from a signal source and amplifying the input signal to develop at an output thereof an output signal;
   a second amplifier being supplied with the input signal from said input signal source and amplifying the input signal to develop at an output thereof an output signal having an opposite phase to the output signal of the first amplifier;
   a load connected between the outputs of the first and second amplifiers; and
   distortion detecting circuit means for detecting the distortion generated in said first amplifier and applying a detected distortion signal to said second amplifier;
   the output of said second amplifier having a distortion with a same amplitude and phase as the distortion appearing at the output of said first amplifier.

2. An amplifier circuit according to claim 1, wherein said signal source is made of two input signal sources having the same amplitude and opposite phases to each other, and said first and second amplifiers effect amplifications of input signals from said two input signal sources respectively so as to develop said output signals each having the opposite phase to each other.

3. An amplifier circuit according to claim 1, wherein said signal source is made of one input signal source, and said first and second amplifiers effect amplifications of input signal from said one input signal source respectively so as to develop said output signals each having the opposite phase to each other.

4. An amplifier circuit comprising:
   a first amplifier being supplied with an input signal from a signal source and amplifying the input signal to develop at an output thereof an output signal having the same phase as the input signal;
   a second amplifier being supplied with the input signal from said signal source and amplifying the input signal to develop at an output thereof an output signal having an opposite phase to the input signal;
   a load connecting between the outputs of the first and second amplifiers; and
   distortion detecting circuit means for detecting the distortion generated in one of said first and second amplifiers and applying a detected distortion signal to the other of said first and second amplifiers;
   the output of the other of said first and second amplifiers having a distortion with a same amplitude and polarity as the distortion appearing at the output of the one of said first and second amplifiers;
   wherein said signal source is made of two input signal sources having the same amplitude and opposite phases to each other, and said first and second amplifiers effect amplifications of input signals from said two input signal sources respectively so as to develop said output signals each having the opposite phase to each other;
   wherein said first amplifier has non-inverting and inverting inputs, one of said two input signals being applied between said non-inverting input and ground, a first resistor whose value is $R_1$ being connected between said inverting input and ground and a second resistor whose value is $R_2$ being connected between said inverting input and output thereof, said second amplifier has non-inverting and inverting inputs, the other of said two input signals being applied between said non-inverting input and ground, a third resistor whose value is $R_6$ being connected between said inverting input and output thereof; and said distortion detecting circuit means comprises a third amplifier having non-inverting and inverting inputs and an output, a fourth resistor whose value is $R_3$ being connected between the output of said first amplifier and the inverting input of said third amplifier, a fifth resistor whose value is $R_4$ being connected between the inverting input and output of said third amplifier, and a sixth resistor whose value is $R_5$ being connected between the inverting input of said second amplifier and the output of said third amplifier, and wherein:

$$\frac{R_2}{R_1} = \frac{R_3}{R_4} = \frac{R_6}{R_5}$$

5. An amplifier circuit comprising:
a first amplifier being supplied with an input signal from a signal source and amplifying the input signal to develop at an output thereof an output signal having the same phase as the input signal;
a second amplifier being supplied with the input signal from said signal source and amplifying the input signal to develop at an output thereof an output signal having an opposite phase to the input signal;
a load connected between the outputs of the first and second amplifiers; and
distortion detecting circuit means for detecting the distortion generated in one of said first and second amplifiers and applying a detected distortion signal to the other of said first and second amplifiers;
the output of the other of said first and second amplifiers having a distortion with the same amplitude and polarity as the distortion appearing at the output of the one of said first and second amplifiers;
wherein said signal source is made of one input signal source, and said first and second amplifiers effect amplifications of input signal from said one input signal source respectively so as to develop said output signals each having the opposite phase to each other;
wherein said first amplifier has non-inverting and inverting inputs, said input signal being applied through a seventh resistor whose value is $R_{11}$, an eighth resistor whose value is $R_{12}$ being connected between said inverting input and output thereof, said non-inverting input being grounded,
said second amplifier has non-inverting and inverting inputs, said input signal being applied between said non-inverting input and ground, a ninth resistor whose value is $R_{17}$ being connected between said inverting input and output thereof, and
said distortion detecting circuit means comprises a fourth amplifier having non-inverting and inverting inputs and an output, a tenth resistor whose value is $R_{13}$ being connected between the output of said first amplifier and the inverting input of said fourth amplifier, an eleventh resistor whose value is $R_{14}$ being connected between the output and inverting input of said fourth amplifier, said input signal being applied through a twelfth resistor whose value is $R_{15}$ to the inverting input of said fourth amplifier, the non-inverting input thereof being grounded, and a thirteenth resistor whose value is $R_{16}$ being connected between the inverting input of said second amplifier and the output of said fourth amplifier, and wherein:

$$\frac{R_{14} \cdot R_{17}}{R_{13} \cdot R_{16}} = 1 \text{ and } \frac{R_{12}}{R_{11}} = \frac{R_{13}}{R_{15}}$$

6. An amplifier circuit according to any one of the preceding claims 1 to 5, wherein said first amplifier comprises a power amplifier, said second amplifier comprises a power amplifier with relatively low distortion, and said distortion detecting circuit means comprises a voltage amplifier.

7. An amplifier circuit comprising;
first and second input signal sources having the same amplitude and opposite phases to each other;
a first amplifier having non-inverting and inverting inputs and an output, an input signal from said first input signal source being applied between said non-inverting input and ground, and a first resistor whose value is R1 being connected between said inverting input and ground while a second resistor whose value is R2 is connected between said inverting input and said output;
a second amplifier having non-inverting and inverting inputs and an output, an input signal from said second input signal source being applied between said non-inverting input and ground, and a third resistor whose value is R6 being connected between said inverting input and said output;
a load connected between the outputs of said first and second amplifiers; and
distortion detecting circuit means comprising a third amplifier having non-inverting and inverting inputs and an output, said non-inverting input being connected to the non-inverting input of said first amplifier, a fourth resistor whose value is R3 being connected between the output of said first amplifier and the inverting input of said third amplifier, and a fifth resistor whose value is R4 being connected between the inverting input and output of said third amplifier while a sixth resistor whose value is R5 is connected between the inverting input of said second amplifier and the output of said third amplifier;
wherein $$\frac{R2}{R1} = \frac{R3}{R4} = \frac{R6}{R5}.$$

8. An amplifier circuit comprising:
a single input signal source;
a first amplifier having non-inverting and inverting inputs and an output, an input signal from said input signal source being applied to said inverting input through a first resistor whose value is R11, and a second resistor whose value is R12 being connected between said inverting input and output while said non-inverting input is grounded;

a second amplifier having non-inverting and inverting inputs and an output, said input signal being applied between said non-inverting input and ground, and a third resistor whose value is R17 being connected between said inverting input and output;

a load connected between the outputs of said first and second amplifiers; and distortion detecting circuit means comprising a third amplifier having non-inverting and inverting inputs and an output, a fourth resistor whose value is R13 being connected between the output of said first amplifier and the inverting input of said third amplifier, a fifth resistor whose value is R14 being connected between the output and inverting input of said third amplifier, said input signal being applied through a sixth resistor whose value is R15 to the inverting input of said third amplifier while the non-inverting input of said third amplifier is grounded, and a seventh resistor whose value is R16 being connected between the inverting input of said second amplifier and the output of said third amplifier;

wherein $$\frac{R14 \cdot R17}{R13 \cdot R16} = 1 \text{ and } \frac{R12}{R11} = \frac{R13}{R15}.$$

9. An amplifier circuit according to claim 7 or claim 8, wherein said first amplifier comprises a power amplifier, said second amplifier comprising a power amplifier having lower distortion than said first amplifier, and said third amplifier comprising a voltage amplifier.

* * * * *